(12) United States Patent
Wang

(10) Patent No.: US 10,037,741 B2
(45) Date of Patent: Jul. 31, 2018

(54) SHIFT REGISTER UNIT AND DRIVING METHOD THEREOF, AS WELL AS ARRAY SUBSTRATE GATE DRIVE DEVICE AND DISPLAY PANEL

(71) Applicants: Boe Technology Group Co., Ltd., Beijing (CN); Beijing Boe Display Technology Co., Ltd., Beijing (CN)

(72) Inventor: Zheng Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 145 days.

(21) Appl. No.: 14/913,315

(22) PCT Filed: Aug. 4, 2015

(86) PCT No.: PCT/CN2015/085996
§ 371 (c)(1),
(2) Date: Feb. 19, 2016

(87) PCT Pub. No.: WO2016/161727
PCT Pub. Date: Oct. 13, 2016

(65) Prior Publication Data
US 2017/0039978 A1 Feb. 9, 2017

(30) Foreign Application Priority Data

Apr. 9, 2015 (CN) .......................... 2015 1 0166593

(51) Int. Cl.
*G11C 19/00* (2006.01)
*G09G 3/36* (2006.01)
*G11C 19/28* (2006.01)

(52) U.S. Cl.
CPC ............. *G09G 3/3688* (2013.01); *G09G 3/36* (2013.01); *G11C 19/28* (2013.01); *G09G 3/3677* (2013.01);
(Continued)

(58) Field of Classification Search
None
See application file for complete search history.

(56) References Cited

U.S. PATENT DOCUMENTS 8,537,094 B2 * 9/2013 Yang .................... G09G 3/3677
345/100
9,524,688 B2 * 12/2016 Dai .......................... G09G 3/36
(Continued)

FOREIGN PATENT DOCUMENTS

CN 1862650 11/2006
CN 101335050 12/2008
(Continued)

OTHER PUBLICATIONS

Office action from Chinese Application No. 201510166953.3 dated Aug. 24, 2016.
(Continued)

*Primary Examiner* — Tuan T Lam
(74) *Attorney, Agent, or Firm* — Calfee, Halter & Griswold LLP

(57) ABSTRACT

The present disclosure provides a shift register unit and a driving method thereof, as well as an array substrate gate driving device and a display panel, to decrease a duty cycle of a thin-film transistor connected to the pull-down node in order to prevent the thin-film transistor from aging and increase the lifetime of the thin-film transistor. The shift register unit includes an input module, an output module, a reset module, a function module, a first pull-down module and a second pull-down module; wherein the first pull-down
(Continued)

module is configured to provide a low level of the second square wave signal to the pull-up node and the output lead in response to a high level of the first square wave signal and a high level signal at the first pull-down node; the second pull-down module is configured to provide a low level of the first square wave signal to the pull-up node and the output lead in response to a high level of the second square wave signal and the high level signal at the second pull-down node.

13 Claims, 6 Drawing Sheets

(52) U.S. Cl.
CPC ............. *G09G 2300/0809* (2013.01); *G09G 2310/0286* (2013.01); *G09G 2310/08* (2013.01)

(56) References Cited

U.S. PATENT DOCUMENTS

| | | | |
|---|---|---|---|
| 2006/0139292 A1 | 6/2006 | Yoon et al. | |
| 2006/0290390 A1* | 12/2006 | Jang | G11C 19/28 327/112 |
| 2009/0304138 A1 | 12/2009 | Tsai et al. | |
| 2016/0140926 A1* | 5/2016 | Xiao | G09G 3/3677 345/215 |
| 2016/0248417 A1* | 8/2016 | Xiao | G09G 3/3677 |
| 2016/0253938 A1* | 9/2016 | Yu | G09G 3/3674 345/214 |
| 2016/0275895 A1* | 9/2016 | Dai | G09G 3/36 |
| 2016/0343332 A1* | 11/2016 | Cao | G09G 3/3677 |
| 2016/0343335 A1* | 11/2016 | Cao | G09G 3/36 |

FOREIGN PATENT DOCUMENTS

| | | |
|---|---|---|
| CN | 101645308 | 2/2010 |
| CN | 102592561 | 7/2012 |
| CN | 103021354 | 4/2013 |
| CN | 103258494 | 8/2013 |
| CN | 104064158 | 9/2014 |
| CN | 104252853 | 12/2014 |
| CN | 104299591 | 1/2015 |
| CN | 104376826 | 2/2015 |
| CN | 104485086 | 4/2015 |
| CN | 104732945 | 6/2015 |
| KR | 20060129881 | 12/2006 |
| KR | 20110132738 | 12/2011 |
| TW | 200707392 | 2/2006 |

OTHER PUBLICATIONS

International Search Report and Written Opinion from PCT/CN15/85996 dated Jan. 4, 2016.
Office action from Chinese Application No. 201510166593.3 dated Feb. 15, 2017.

\* cited by examiner

SHIFT REGISTER UNIT AND DRIVING METHOD THEREOF, AS WELL AS ARRAY SUBSTRATE GATE DRIVE DEVICE AND DISPLAY PANEL

RELATED APPLICATIONS

The present application is the U.S. national phase entry of PCT/CN2015/085996 with an International filing date of Aug. 4, 2015, which claims the benefit of Chinese Application No. 201510166593.3, filed on Apr. 9, 2015, the entire disclosures of which are incorporated herein by reference.

TECHNICAL FIELD

The present disclosure relates to the field of liquid crystal display driving technology, in particular to a shift register unit and a driving method thereof, as well as an array substrate gate driving device and a display panel.

BACKGROUND OF THE INVENTION

In recent years, shift register (Gate on Array, GOA) technology is widely applied in liquid crystal display panel, hence people have increasingly high requirements to the lifetime of GOA, work consumption of GOA and the work stability of GOA.

In prior art, a circuit structure of one GOA unit is shown with reference to FIG. 1, wherein VDD is a direct current high voltage, so that the eighth thin-film transistor M8 is kept at on-state due to the high voltage of VDD and thus a pull-down node PD point is at high level. Therefore, when PD is at high level state, the sixth thin-film transistor M6 and the fourth thin-film transistor M4 are at on-state. Only when the pull-up node PU point is at high level, the ninth thin-film transistor M9 is turned on, such that the PD point is at low level, thereby the sixth thin-film transistor M6 and the fourth thin-film transistor M4 connected to the pull-down node are cutoff. However, as the duration in which the PD node is at high level is much longer than the duration in which the PD node is at low level, the gates of the sixth thin-film transistor M6 and the fourth thin-film transistor M4 connected to the pull-down node are at high level for long time, i.e. at a high duty cycle state, thereby the lifetime of the thin-film transistors is affected.

SUMMARY OF THE INVENTION

Embodiments of the present disclosure provide a shift register unit and a driving method thereof, as well as an array substrate gate driving device and a display panel, to decrease a duty cycle of a thin-film transistor connected to the pull-down node in order to prevent the thin-film transistor from aging and increase the lifetime of the thin-film transistor.

An embodiment of the present disclosure provides a shift register unit including an input module, an output module, a reset module, a function module, a first pull-down module and a second pull-down module; wherein a control terminal of the first pull-down module is connected to a first pull-down node, a first input terminal of the first pull-down module is connected to a first square wave signal, a second input terminal of the first pull-down module is connected to a second square wave signal, a first output terminal of the first pull-down module is connected to a pull-up node, and a second output terminal of the first pull-down module is connected to an output lead; a control terminal of the second pull-down module is connected to a second pull-down node, a first input terminal of the second pull-down module is connected to the second square wave signal, a second input terminal of the second pull-down module is connected to the first square wave signal, a first output terminal of the second pull-down module is connected to the pull-up node, and a second output terminal of the second pull-down module is connected to the output lead; wherein the first pull-down node is a first output node of the function module, the second pull-down node is a second output node of the function module, and the pull-up node is an output node of the input module;

the first pull-down module is configured to provide a low level of the second square wave signal to the pull-up node and the output lead in response to a high level of the first square wave signal and a high level signal at the first pull-down node;

the second pull-down module is configured to provide a low level of the first square wave signal to the pull-up node and the output lead in response to a high level of the second square wave signal and the high level signal at the second pull-down node;

and wherein the second square wave signal is at low level when the first square wave signal is at high level, and the second square wave signal is at high level when the first square wave signal is at low level.

Advantageous of the shift register unit according to embodiments of the present disclosure reside in that: when the high level of the first square wave signal and the high level signal at the first pull-up node are responded by the first pull-down module, a thin-film transistor connected to the first pull-down node is turned on such that the duty cycle of a thin-film transistor connected to the second pull-down node is decreased; and when the high level of the second square wave signal and the high level signal at the second pull-down node are responded by the second pull-down module, a thin-film transistor connected to the second pull-down node is turned on such that the duty cycle of a thin-film transistor connected to the first pull-down node is decreased. By enabling the thin-film transistor connected to the first pull-down node and the thin-film transistor connected to the second pull-down node alternately, the duty cycle of the thin-film transistor connected to the first pull-down node and the duty cycle of the thin-film transistor connected to the second pull-down node is decreased in order to prevent the thin-film transistors from aging and increase the lifetime of the thin-film transistors.

Optionally, an input terminal and a control terminal of the input module are connected to an input signal, and an output terminal of the input module is the pull-up node. The input module is configured to provide the input signal to the pull-up node in response to the input signal.

Optionally, a control terminal of the output module is connected to the output terminal of the input module, an input terminal of the output module is connected to a clock signal, and an output terminal of the output module is connected to the output lead. The output module is configured to provide a voltage of the clock signal to the output lead in response to a voltage signal at the pull-up node.

Optionally, a control terminal of the reset module is connected to a reset signal, an input terminal of the reset module is connected to a cathode of a power supply, a first output terminal of the reset module is connected to the pull-up node, and a second output terminal of the reset module is connected to the output lead; and the reset module is configured to provide a voltage of the cathode of the power supply to the pull-up node and the output lead in response to the reset signal.

Optionally, a control terminal of the function module is connected to the pull-up node, an input terminal of the function module is connected to is connected to the cathode of the power supply, a first output terminal of the function module is connected to the first pull-down node, and a second output terminal of the function module is connected to the second pull-down node; and the function module is configured to provide the voltage of the cathode of the power supply to the first pull-down node and the second pull-down node in response to the voltage signal at the pull-up node.

Optionally, the input module includes: a first thin-film transistor, wherein a gate and a source of the first thin-film transistor are connected to an input signal terminal, a drain of the first thin-film transistor serves as the output node of the input module, i.e. the pull-up node.

Optionally, the output module includes: a second thin-film transistor, wherein a gate of the second thin-film transistor is connected to the pull-up node, a source of the second thin-film transistor is connected to a clock signal input terminal, and a drain of the second thin-film transistor is connected to the output lead; and a first capacitor connected between the pull-up node and the output lead.

Optionally, the reset module includes: a third thin-film transistor, wherein a gate of the third thin-film transistor is connected to a reset signal input terminal, a source of the third thin-film transistor is connected to a power supply cathode voltage terminal, and a drain of the third thin-film transistor is connected to the pull-up node; and a fourth thin-film transistor, wherein a gate of the fourth thin-film transistor is connected to the reset signal input terminal, a source of the fourth thin-film transistor is connected to the power supply cathode voltage terminal, and a drain of the fourth thin-film transistor is connected to the output lead.

Optionally, the function module includes: a fifth thin-film transistor, wherein a gate of the fifth thin-film transistor is connected to the pull-up node, a source of the fifth thin-film transistor is connected to the power supply cathode voltage terminal, and a drain of the fifth thin-film transistor serves as the first output node of the function module, i.e. the first pull-down node; and a sixth thin-film transistor, wherein a gate of the sixth thin-film transistor is connected to the pull-up node, a source of the sixth thin-film transistor is connected to the first pull-down node, and a drain of the sixth thin-film transistor serves as the second output node of the function module, i.e. the second pull-down node.

Optionally, the first pull-down module includes: a seventh thin-film transistor, wherein a gate and a source of the seventh thin-film transistor are connected to a first square wave signal input terminal and a drain of the seventh thin-film transistor is connected to the first pull-down node; an eighth thin-film transistor, wherein a gate of the eighth thin-film transistor is connected to the first pull-down node, a source of the eighth thin-film transistor is connected to a second square wave signal input terminal, and a drain of the eighth thin-film transistor is connected to the output lead; a ninth thin-film transistor, wherein a gate of the ninth thin-film transistor is connected to the first pull-down node, a source of the ninth thin-film transistor is connected to the second square wave signal input terminal, and a drain of the ninth thin-film transistor is connected to the pull-up node; a second capacitor connected between the first pull-down node and the second square wave signal input terminal; and a third capacitor connected in parallel with the second capacitor.

Optionally, the second pull-down module includes: a tenth thin-film transistor, wherein a gate and a source of the tenth thin-film transistor are connected to the second square wave signal input terminal, and a drain of the tenth thin-film transistor is connected to the second pull-down node; a eleventh thin-film transistor, wherein a gate of the eleventh thin-film transistor is connected to the second pull-down node, a source of the eleventh thin-film transistor is connected to the first square wave signal input terminal, and a drain of the eleventh thin-film transistor is connected to the output lead; a twelfth thin-film transistor, wherein a gate of the twelfth thin-film transistor is connected to the second pull-down node, a source of the twelfth thin-film transistor is connected to the first square wave signal input terminal, and a drain of the twelfth thin-film transistor is connected to the pull-up node; a fourth capacitor connected between the second pull-down node and the first square wave signal input terminal; and a fifth capacitor connected in parallel with the fourth capacitor.

With the first and second pull-down modules provided in the embodiments of the present disclosure, at a time instance, the first pull-down module is enabled while the second pull-down module is disabled in order to decrease the duty cycle of the thin-film transistors connected to the second pull-down node in the second pull-down module; or the second pull-down module is enabled while the first pull-down module is disabled in order to decrease the duty cycle of the thin-film transistors connected to the first pull-down node in the first pull-down module. As the first pull-down module and the second pull-down module are enabled alternately, the thin-film transistors connected to the first pull-down node and the thin-film transistors connected to the second pull-down node are turned on alternately, such that the duty cycle of the thin-film transistors connected to the first pull-down node and the thin-film transistors connected to the second pull-down node is decreased in order to prevent the thin-film transistors from aging and increase the lifetime of the thin-film transistors.

An embodiment of the present disclosure further provides a driving method of a shift register unit, the method including:

providing, by an input module, a voltage of a input signal to a pull-up node when the input signal is received;

providing, by an output module, a voltage of a clock signal to an output lead upon a voltage signal of the pull-up node is received;

providing, by a reset module, a voltage of a cathode of a power supply to the pull-up node and an output lead when a reset signal is received;

providing, by a function module, the voltage of the cathode of the power supply to a first pull-down node and a second pull-down node upon the voltage signal of the pull-up node is received;

providing, by a first pull-down module, a low level of a second square wave signal to the pull-up node and the output lead upon a high level of a first square wave signal and a high level signal at the first pull-down node are received; and providing, by a second pull-down module, a low level of a first square wave signal to the pull-up node and the output lead upon a high level of a second square wave signal and a high level signal at the second pull-down node are received;

wherein the first pull-down node is a first output node of the function module, the second pull-down node is a second output node of the function module, and the pull-up node is an output node of the input module; and wherein the second square wave signal is at low level when the first square wave signal is at high level, and the second square wave signal is at high level when the first square wave signal is at low level.

With the first and second pull-down modules provided in the embodiments of the present disclosure, at a time instance, the first pull-down module is enabled while the second pull-down module is disabled in order to decrease the duty cycle of the thin-film transistors connected to the second pull-down node in the second pull-down module; or the second pull-down module is enabled while the first pull-down module is disabled in order to decrease the duty cycle of the thin-film transistors connected to the first pull-down node in the first pull-down module. As the first pull-down module and the second pull-down module are enabled alternately, the thin-film transistors connected to the first pull-down node and the thin-film transistors connected to the second pull-down node are turned on alternately, such that the duty cycle of the thin-film transistors connected to the first pull-down node and the thin-film transistors connected to the second pull-down node is decreased in order to prevent the thin-film transistors from aging and increase the lifetime of the thin-film transistors.

An embodiment of the present disclosure provides an array substrate gate driving device including cascaded shift register units according to the embodiment of the present disclosure.

An embodiment of the present disclosure provides a display panel including the array substrate gate driving device according to the embodiment of the present disclosure.

DETAILED DESCRIPTION OF THE INVENTION

Solutions in the embodiments of the present disclosure will be described below clearly and completely in combination with drawings related to the embodiments of the present disclosure, and obviously the described embodiments are merely some, not all of the embodiments of the present disclosure. Any other embodiment obtained by persons skilled in the art based on the embodiments in the present disclosure without inventive effort falls within the scope of the present disclosure.

Embodiments of the present disclosure provide a shift register unit and a driving method thereof, as well as an array substrate gate driving device and a display panel, to decrease a duty cycle of a thin-film transistor connected to the pull-down node in order to prevent the thin-film transistor from aging and increase the lifetime of the thin-film transistor.

It should be noted that the clock signal provided in the embodiments of the present disclosure includes existing clock signals CLK and CLKB. Generally, a structure of the array substrate gate driving device is formed by a plurality of shift register units which are cascaded, and the structure of the array substrate gate driving device includes multiple lines of shift register units with one shift register unit per line. A clock signal inputted to a shift register unit corresponding to each odd line is CLK, and a clock signal inputted by a shift register unit corresponding to each even line is CLKB. The voltage VSS of the cathode of the power supply according to the embodiments of the present disclosure is a low level, and the thin-film transistors TFTs according to the embodiments of the present disclosure may be only N-type TFTs, only P-type TFTs, or a combination of N-type TFTs and P-type TFTs. Particularly, detailed description is made by means of example where the thin-film transistors TFTs are only N-type TFTs and each TFT is turned on when its gate voltage is at high level and cutoff when its gate voltage is at low level.

The shift register unit according to the embodiments of the present disclosure is an improvement to the existing shift register unit under amorphous silicon process. An embodiment of the present disclosure provides a square wave signal to be provided to the pull-down units, wherein the square wave signal includes a first square wave signal and a second square wave signal, each being a square wave switching between a high level and a low level and having a frequency in a range from 1 HZ to 3 HZ.

Figure 1:
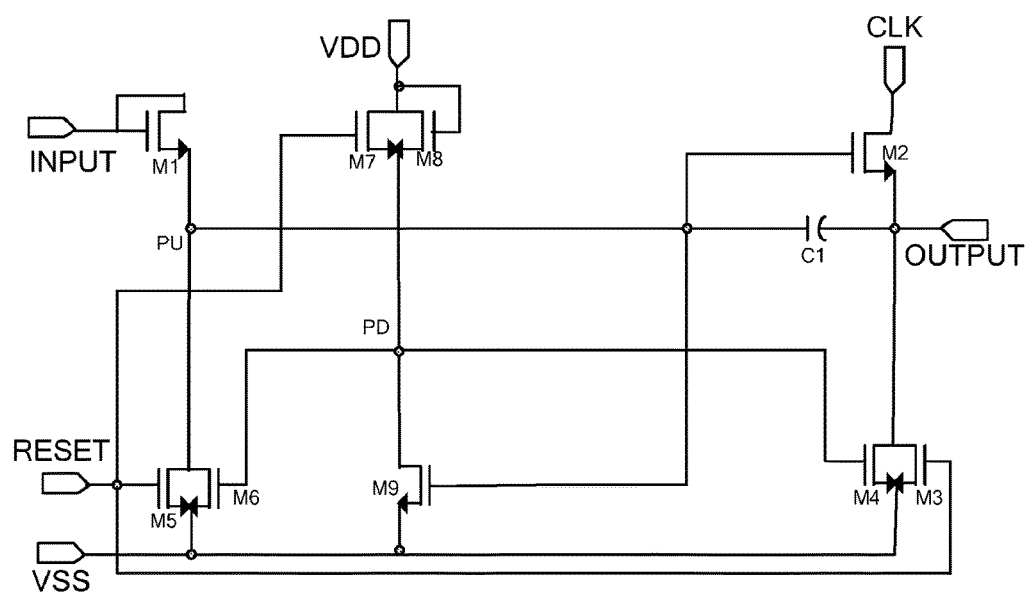
FIG. 1 is a structural schematic diagram of a shift register unit in the prior art.
Figure 2:
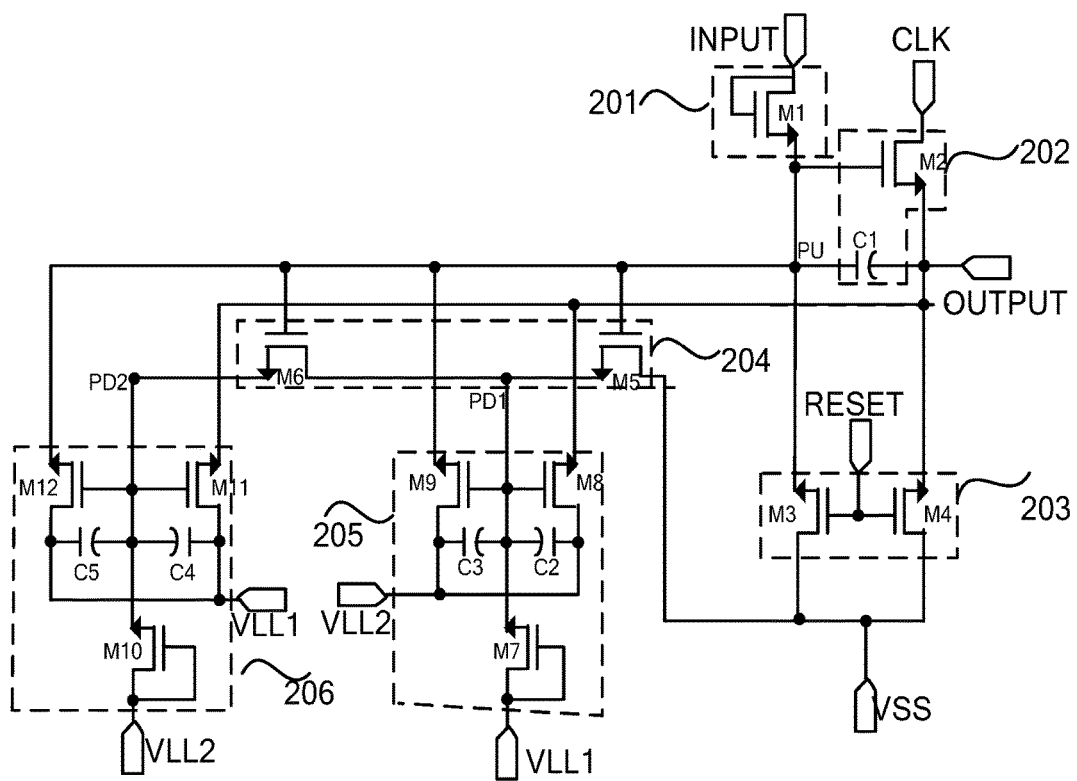
FIG. 2 is a structural schematic diagram of a shift register unit according to an embodiment of the present disclosure.

With reference to FIG. 2, an embodiment of the present disclosure provides a shift register unit including an input module 201, an output module 202, a reset module 203, a function module 204, a first pull-down module 205 and a second pull-down module 206.

An input terminal and a control terminal of the input module 201 are connected to an input signal INPUT, and an output terminal of the input module 201 is connected to the pull-up node PU point; a control terminal of the output module 202 is connected to the output terminal of the input module 201, an input terminal of the output module 202 is connected to a clock signal CLK, and an output terminal of the output module 202 is connected to the output lead OUTPUT; a control terminal of the reset module 203 is connected to a reset signal RESET, an input terminal of the reset module 203 is connected to a cathode VSS of a power supply, a first output terminal of the reset module 203 is connected to the pull-up node PU point, and a second output terminal of the reset module 203 is connected to the output lead OUTPUT; a control terminal of the function module 204 is connected to the pull-up node PU point, an input terminal of the function module 204 is connected to is connected to the cathode VSS of the power supply, a first output terminal of the function module 204 is connected to the first pull-down node PD1, and a second output terminal of the function module 204 is connected to the second pull-down node PD2; a control terminal of the first pull-down module 205 is connected to a first pull-down node PD1, a first input terminal of the first pull-down module 205 is connected to a first square wave signal VLL1, a second input terminal of the first pull-down module 205 is connected to a second square wave signal VLL2, a first output terminal of the first pull-down module 205 is connected to a pull-up node PU point, and a second output terminal of the first pull-down module 205 is connected to an output lead OUTPUT; a control terminal of the second pull-down module 206 is connected to a second pull-down node PD2, a first input terminal of the second pull-down module 206 is connected to the second square wave signal VLL2, a second input terminal of the second pull-down module 206 is connected to the first square wave signal VLL1, a first output terminal of the second pull-down module 206 is connected to the pull-up node PU point, and a second output terminal of the second pull-down module 206 is connected to the output lead OUTPUT.

In the embodiments of the present disclosure, each module has its control terminal connected to the gate of the thin-film transistor, its input terminal connected to the source of the thin-film transistor, and its output terminal connected to the drain of the thin-film transistor. Of course, each module may have its control terminal connected to the gate of the thin-film transistor, its input terminal connected to the drain of the thin-film transistor, and its output terminal connected to the source of the thin-film transistor, and this is not limited by the embodiments of the present disclosure.

The input module 201 is configured to provide the input signal INPUT to the pull-up node PU point in response to the input signal INPUT, wherein the pull-up node PU point is an output node of the input module 201. The input module may include: a first thin-film transistor M1, wherein a gate and a source of the first thin-film transistor M1 are connected to an input signal terminal INPUT, a drain of the first thin-film transistor M1 serves as the output node of the input module, i.e. the pull-up node PU point.

The output module 202 is configured to provide a voltage of the clock signal CLK to the output lead OUTPUT in response to a voltage signal at the pull-up node PU point. The output module 202 includes: a second thin-film transistor M2, wherein a gate of the second thin-film transistor M2 is connected to the pull-up node PU point, a source of the second thin-film transistor M2 is connected to a clock signal input terminal CLK, and a drain of the second thin-film transistor M2 is connected to the output lead OUTPUT; and a first capacitor C1 connected between the pull-up node PU point and the output lead OUTPUT.

The reset module 203 is configured to provide a voltage VSS of the cathode of the power supply to the pull-up node PU point and the output lead OUTPUT in response to the reset signal RESET. The reset module includes: a third thin-film transistor M3, wherein a gate of the third thin-film transistor M3 is connected to a reset signal input terminal RESET, a source of the third thin-film transistor M3 is connected to a power supply cathode voltage terminal VSS, and a drain of the third thin-film transistor M3 is connected to the pull-up node PU point and serves as the first output terminal of the reset module 203; and a fourth thin-film transistor M4, wherein a gate of the fourth thin-film transistor M4 is connected to the reset signal input terminal RESET, a source of the fourth thin-film transistor M4 is connected to the power supply cathode voltage terminal VSS, and a drain of the fourth thin-film transistor M4 is connected to the output lead OUTPUT and serves as the second output terminal of the reset module 203.

The function module 204 is configured to provide the voltage VSS of the cathode of the power supply to the first pull-down node PD1 and the second pull-down node PD2 in response to the voltage signal at the pull-up node PU point, wherein the first pull-down node PD1 is the first output node of the function module 204, and the second pull-down node PD2 is the second output node of the function module 204. The function module includes: a fifth thin-film transistor M5, wherein a gate of the fifth thin-film transistor M5 is connected to the pull-up node PU point, a source of the fifth thin-film transistor M5 is connected to the power supply cathode voltage terminal VSS, and a drain of the fifth thin-film transistor M5 serves as the first output node of the function module, i.e. the first pull-down node PD1; and a sixth thin-film transistor M6, wherein a gate of the sixth thin-film transistor M6 is connected to the pull-up node PU point, a source of the sixth thin-film transistor M6 is connected to the first pull-down node PD1, and a drain of the sixth thin-film transistor M6 serves as the second output node of the function module, i.e. the second pull-down node PD2.

The first pull-down module 205 is configured to provide a low level of the second square wave signal VLL2 to the pull-up node PU point and the output lead OUTPUT in response to a high level of the first square wave signal VLL1 and a high level signal at the first pull-down node PD1. The first pull-down module includes: a seventh thin-film transistor M7, wherein a gate and a source of the seventh thin-film transistor M7 are connected to a first square wave signal input terminal VLL1, a drain of the seventh thin-film transistor M7 is connected to the first pull-down node PD1, and the source of the seventh thin-film transistor M7 serves as the first input terminal of the first pull-down module 205; an eighth thin-film transistor M8, wherein a gate of the eighth thin-film transistor M8 is connected to the first pull-down node PD1, a source of the eighth thin-film transistor M8 is connected to a second square wave signal input terminal VLL2, and a drain of the eighth thin-film transistor M8 is connected to the output lead OUTPUT and serves as the second output terminal of the first pull-down module 205; a ninth thin-film transistor M9, wherein a gate of the ninth thin-film transistor M9 is connected to the first pull-down node PD1, a source of the ninth thin-film transistor M9 is connected to the second square wave signal input terminal VLL2, a drain of the ninth thin-film transistor M9 is connected to the pull-up node PU point, the source of the ninth thin-film transistor M9 serves as the second input terminal of the first pull-down module 205, and the drain of the ninth thin-film transistor M9 serves as the first output terminal of the first pull-down module 205; a second capacitor C2 connected between the first pull-down node PD1 and the second square wave signal input terminal VLL2; and a third capacitor C3 connected in parallel with the second capacitor C2.

The second pull-down module 206 is configured to provide a low level of the first square wave signal VLL1 to the pull-up node PU and the output lead OUTPUT in response to the high level of the second pull-down node voltage signal PD2 and a high level of the second square wave signal VLL2. The second pull-down module includes: a tenth thin-film transistor M10, wherein a gate and a source of the tenth thin-film transistor M10 are connected to the second square wave signal input terminal VLL2, a drain of the tenth thin-film transistor M10 is connected to the second pull-down node PD2, and the source of the tenth thin-film transistor M10 serves as the first input terminal of the second pull-down module 206; a eleventh thin-film transistor M11, wherein a gate of the eleventh thin-film transistor M11 is connected to the second pull-down node PD2, a source of the eleventh thin-film transistor M11 is connected to the first square wave signal input terminal VLL1, and a drain of the eleventh thin-film transistor M11 is connected to the output lead OUTPUT and serves as the second output terminal of the second pull-down module 206; a twelfth thin-film transistor M12, wherein a gate of the twelfth thin-film transistor M12 is connected to the second pull-down node PD2, a source of the twelfth thin-film transistor M12 is connected to the first square wave signal input terminal VLL1, a drain of the twelfth thin-film transistor M12 is connected to the pull-up node PU point, and the source of the twelfth thin-film transistor M12 serves as the second output terminal of the second pull-down module 206 and the drain of the twelfth thin-film transistor M12 serves as the first output terminal of the second pull-down module 206; a fourth capacitor C4 connected between the second pull-down node PD2 and the first square wave signal input terminal VLL1; and a fifth capacitor C5 connected in parallel with the fourth capacitor C4.

With the first and second pull-down modules provided in the embodiments of the present disclosure, at a time instance, the first pull-down module is enabled while the second pull-down module is disabled in order to decrease the duty cycle of the thin-film transistors connected to the second pull-down node in the second pull-down module; or the second pull-down module is enabled while the first pull-down module is disabled in order to decrease the duty cycle of the thin-film transistors connected to the first pull-down node in the first pull-down module. As the first pull-down module and the second pull-down module are enabled alternately, the thin-film transistors connected to the first pull-down node and the thin-film transistors connected to the second pull-down node are turned on alternately, such that the duty cycle of the thin-film transistors connected to the first pull-down node and the thin-film transistors connected to the second pull-down node is decreased in order to prevent the thin-film transistors from aging and increase the lifetime of the thin-film transistors.

It should be noted that, when the first square wave signal is at high level, the first pull-down module is enabled such that the first pull-down node is at high level to turn on the thin-film transistors connected to the first pull-down node in order to introduce the low level of the second square wave signal into the pull-up node and the output lead, and since the second pull-down node is at low level, the second pull-down module is disabled such that the thin-film transistors connected to the second pull-down node are cutoff, thereby decreasing the duty cycle of the thin-film transistors connected to the second pull-down node; and when the second square wave signal is at high level, the second pull-down module is enabled such that the second pull-down module is at high level to turn on the thin-film transistors connected to the second pull-down node in order to introduce the low level of the first square wave signal into the pull-up node and the output lead, and since the first pull-down node is at low level, the first pull-down module is disabled to cutoff the thin-film transistors connected to the first pull-down node, thereby decreasing the duty cycle of the thin-film transistors connected to the first pull-down node. In conclusion, as the first pull-down module and the second pull-down module are enabled alternately, the thin-film transistors connected to the first pull-down node and the thin-film transistors connected to the second pull-down node are turned on alternately, such that the duty cycle of the thin-film transistors connected to the first pull-down node and the thin-film transistors connected to the second pull-down node is decreased in order to prevent the thin-film transistors from aging and increase the lifetime of the thin-film transistors.

The square wave signals according to the embodiments of the present disclosure include a first square wave signal VLL1 and a second square wave signal VLL2, wherein each of the first square wave signal VLL1 and the second square wave signal VLL2 may have a high-low level switching period which ranges from about 0.3 s to about 1 s. The first square wave signal VLL1 and the second square wave signal VLL2 have opposite high-low level switching directions within one and the same period of time, and the low level of the square wave signals is higher than the voltage VSS of the cathode of the power supply and lower than the turn-on voltage of the thin-film transistors. Generally, the switching period of the clock signal CLK or CLKB in the shift register unit may be about 16 µs. Obviously, the switching frequency of the square wave signal is much smaller than the switching frequency of the clock signal.

Figure 3:
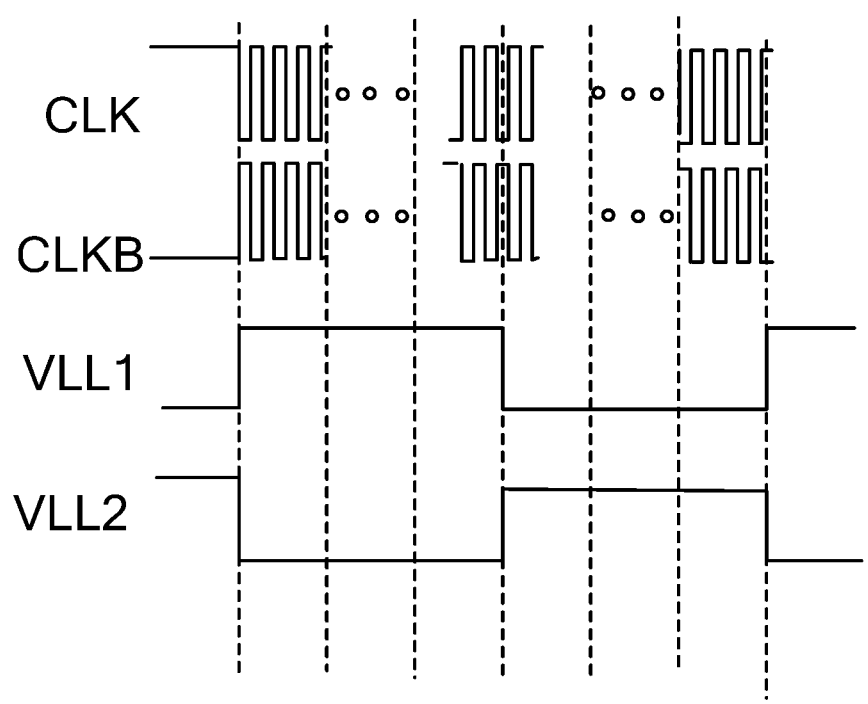
FIG. 3 is a sequence diagram of square wave signals according to an embodiment of the present disclosure.

FIG. 3 is a waveform diagram of the first square wave signal VLL1 and the second square wave signal VLL2 as well as the clock signals CLK and CLKB according to an embodiment of the present disclosure. Obviously, no switching between a high level and a low level occurs in the first and second square wave signals within a plurality of periods of the clock signals CLK and CLKB.

It should be noted that the high-low level switching period of the first square wave signal VLL1 and the second square wave signal VLL2 may be identical to or different from the high-low level switching period of the clock signals CLK and CLKB. No particular limitation is made to the first square wave signal VLL1 and the second square wave signal VLL2 in the embodiments of the present disclosure. Irrespective of the high-low level switching period of the first square wave signal VLL1 and the second square wave signal VLL2, the first and second pull-down modules according to the embodiments of the present disclosure can decrease the duty cycle of the thin-film transistors connected to the first pull-down node and the thin-film transistors connected to the second pull-down node in order to prevent the thin-film transistors from aging and increase the lifetime of the thin-film transistors. Particularly, when the first square wave signal is at high level, the first pull-down module is enabled and when the second square wave signal is at high level, the second pull-down module is enabled, such that the first pull-down module and the second pull-down module are enabled alternately, and thus the duty cycle of the thin-film transistors connected to the first pull-down node and the thin-film transistors connected to the second pull-down node is decreased in order to prevent the thin-film transistors from aging and increase the lifetime of the thin-film transistors.

Next, a driving method of the shift register unit as provided above will be described in detail, the method including:

providing, by an input module, a voltage of a input signal to a pull-up node when the input signal is received;

providing, by an output module, a voltage of a clock signal to an output lead upon a voltage signal of the pull-up node is received;

providing, by a reset module, a voltage of a cathode of a power supply to the pull-up node and an output lead when a reset signal is received;

providing, by a function module, the voltage of the cathode of the power supply to a first pull-down node and a second pull-down node upon the voltage signal of the pull-up node is received;

providing, by a first pull-down module, a low level of a second square wave signal to the pull-up node and the output lead upon a high level of a first square wave signal and a high level signal at the first pull-down node are received; and providing, by a second pull-down module, a low level of a first square wave signal to the pull-up node and the output lead upon a high level of a second square wave signal and a high level signal at the second pull-down node are received;

wherein the first pull-down node is a first output node of the function module, the second pull-down node is a second output node of the function module, and the pull-up node is an output node of the input module; and wherein the second square wave signal is at low level when the first square wave signal is at high level, and the second square wave signal is at high level when the first square wave signal is at low level.

A driving method of the shift register unit according to an embodiment of the present disclosure and its working principle will be described below in detail by means of example where the clock signal of the shift register unit is CLK, the first square wave signal VLL1 is at high level, and the second square wave signal VLL2 is at low level.

Figure 4:
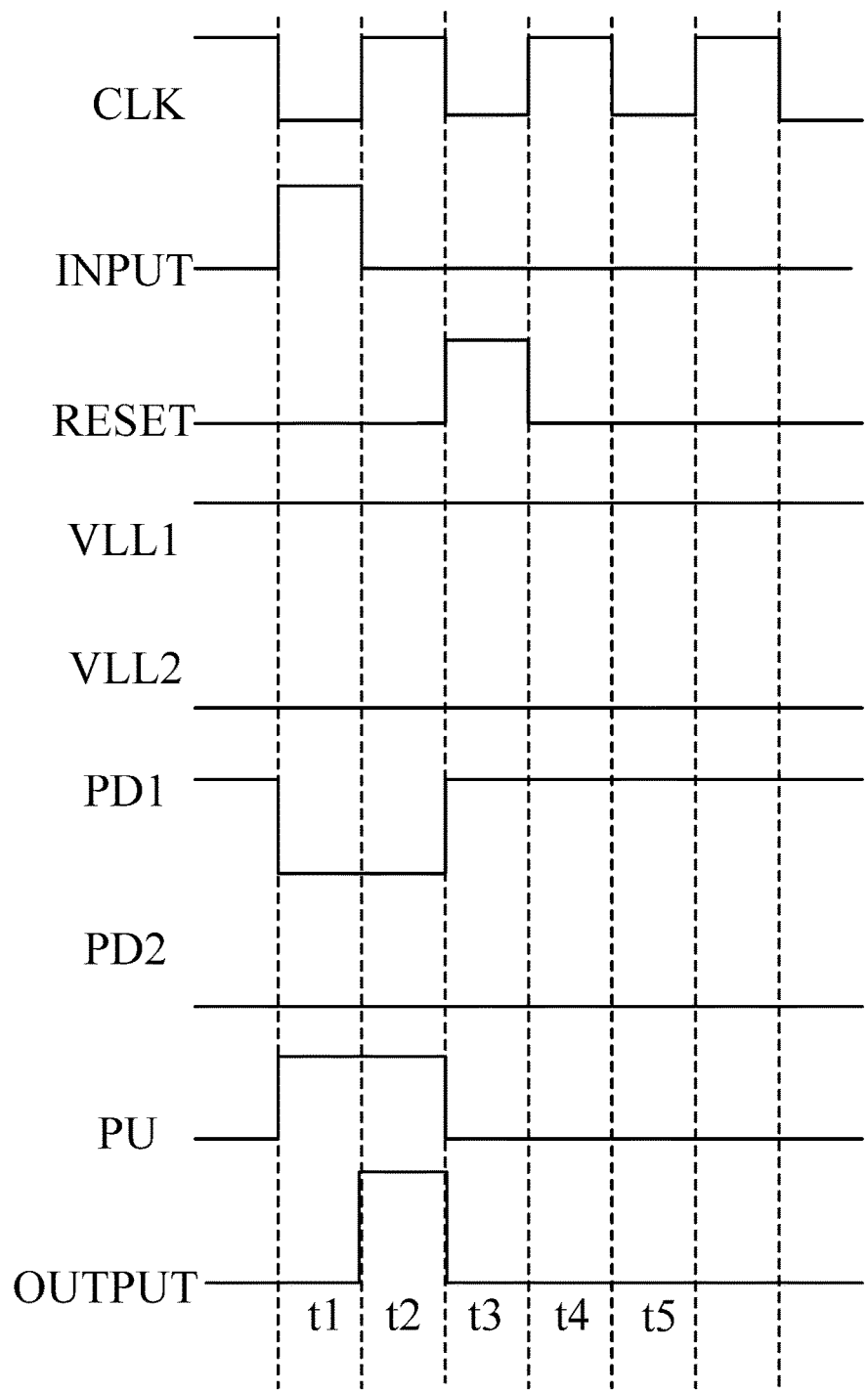
FIG. 4 is a sequence diagram of a type of control signals for a shift register unit according to an embodiment of the present disclosure.

A driving method of the shift register unit according to an embodiment of the present disclosure is described with reference to the sequence diagram of the control signals of FIG. 4, wherein the method includes following stages.

At stage t1, the input signal INPUT is at high level, the clock signal CKL is at low level, and the reset signal RESET is at low level. At this point, the first thin-film transistor M1 is turned on, the pull-up node PU point is at high level, and at the same time the first capacitor C1 is charged. Then, the fifth thin-film transistor M5 is turned on, the voltage VSS of the cathode of the power supply is introduce into the first pull-down node PD1, and the first pull-down node PD1 is at low level; the sixth thin-film transistor M6 is turned on, the voltage VSS of the cathode of the power supply is introduce into the second pull-down node PD2, and the second pull-down node PD2 is at low level. As the first square wave signal VLL1 is at high level and the second square wave signal VLL2 is at low level, the seventh thin-film transistor M7 is turned on, which may introduce the high level of the first square wave signal VLL1 into the first pull-down node PD1. However, as the voltage VSS of the cathode of the power supply is lower than the low level of the square wave signals and the pulling down effect of the low level of the voltage VSS of the cathode of the power supply is greater than the pulling up effect of the high level of the first square wave signal VLL1, the voltage VSS of the cathode of the power supply is introduced into the first pull-down node PD1 due to the turning on of the fifth thin-film transistor M5 such that the first pull-down node PD1 is kept at low level, even if the high level of the first square wave signal VLL1 is introduced into the first pull-down node PD1. Meanwhile, the fourth capacitor C4 and the fifth capacitor C5 are charged by the high level of the first square wave signal VLL1 in the second pull-down module, such that the high level of the first square wave signal VLL1 cannot be introduced into the second pull-down node PD2, and thus the eleventh thin-film transistor M11 and the twelfth thin-film transistor M12 connected to the second pull-down node PD2 are cutoff, thereby decreasing the duty cycle of the thin-film transistors connected to the second pull-down node PD2. As the PU point is at high level, the second thin-film transistor M2 is turned on, the low level of the clock signal CLK is introduced into the output lead OUTPUT, and the output lead OUTPUT outputs a low level.

At stage t2, the input signal INPUT is at low level, the clock signal CLK is at high level, and the reset signal RESET is at low level. At this point, the first thin-film transistor is cutoff, and due to the discharging effect of the first capacitor C1, the PU point is kept at high level. The second thin-film transistor is kept ON, the high level of the clock signal CLK is introduced into the output lead OUTPUT, and the output lead OUTPUT outputs a high level.

At stage t3, the input signal INPUT is at low level, the clock signal CLK is at low level, and the reset signal RESET is at high level. At this point, the third thin-film transistor M3 is turned on, the voltage VSS of the cathode of the power supply is introduced into the pull-up node PU point, and the PU point thus is at low level. The fourth thin-film transistor M4 is turned on, the voltage VSS of the cathode of the power supply is introduced into the output lead OUTPUT, and the output lead OUTPUT is at low level. As the PU point is at low level, the fifth thin-film transistor M5 is cutoff. As the first square wave signal VLL1 is at high level, the seventh thin-film transistor M7 is kept ON. As the fifth thin-film transistor M5 is cutoff, the voltage of the first pull-down node PD1 is affected by only the first square wave signal VLL1, so that the first pull-down node PD1 is at high level, the eighth thin-film transistor M8 is turned on to introduce the low level of the second square wave signal VLL2 into the output lead OUTPUT, and at the same time the ninth thin-film transistor M9 is turned on to introduce the low level of the second square wave signal VLL2 into the pull-up node PU point. As the PU point is at low level, the sixth thin-film transistor M6 is cutoff such that the second pull-down node PD2 is kept at low level.

At stage t4, the input signal INPUT is at low level, the clock signal CLK is at high level, and the reset signal RESET is at low level. At this point, the third thin-film transistor M3 and the fourth thin-film transistor M4 are cutoff and a low level of the pull-up node PU point and the output lead OUTPUT can only be achieved be means of the effect of the first and second pull-down modules. As the first square wave signal VLL1 is at high level, the seventh thin-film transistor M7 is kept ON, the first pull-down node PD1 is kept at high level, the eighth thin-film transistor M8 is turned on to introduce the low level of the second square wave signal VLL2 into the output lead OUTPUT, and at the same time the ninth thin-film transistor M9 is turned on to introduce the low level of the second square wave signal VLL2 into the pull-up node PU point such that the pull-up node PU point is at low level. Accordingly, the output lead OUTPUT outputs a low level at stage t4.

At stage t5, the input signal INPUT is at low level, the clock signal CLK is at low level, and the reset signal RESET is at low level. At this point, the seventh thin-film transistor M7 is kept ON, the first pull-down node PD1 is kept at high level, the eighth thin-film transistor M8 is turned on to introduce the low level of the second square wave signal VLL2 into the output lead OUTPUT, and at the same time the ninth thin-film transistor M9 is turned on to introduce the low level of the second square wave signal VLL2 into the pull-up node PU point. Accordingly, the output lead OUTPUT outputs a low level at stage t4.

After stage t5, stages t4 and t5 are repeated until the sequences of stage t1, stage t2 and stage t3 occur in this order, and stages t1, t2 and t3 are performed again, i.e. the third and fourth thin-film transistors M3 and M4 as well as the eighth and ninth thin-film transistors M8 and M9 discharge the PU point and the OUTPUT point alternately, such that the OUTPUT point and the PU point are kept at low level during any period of time except the period of time during which a high level is outputted.

Additionally, a driving method of the shift register unit according to an embodiment of the present disclosure is described in detail by means of example where the clock signal of the shift register unit is CLK, the first square wave signal VLL1 is at low level, and the second square wave signal is at high level.

Figure 5:
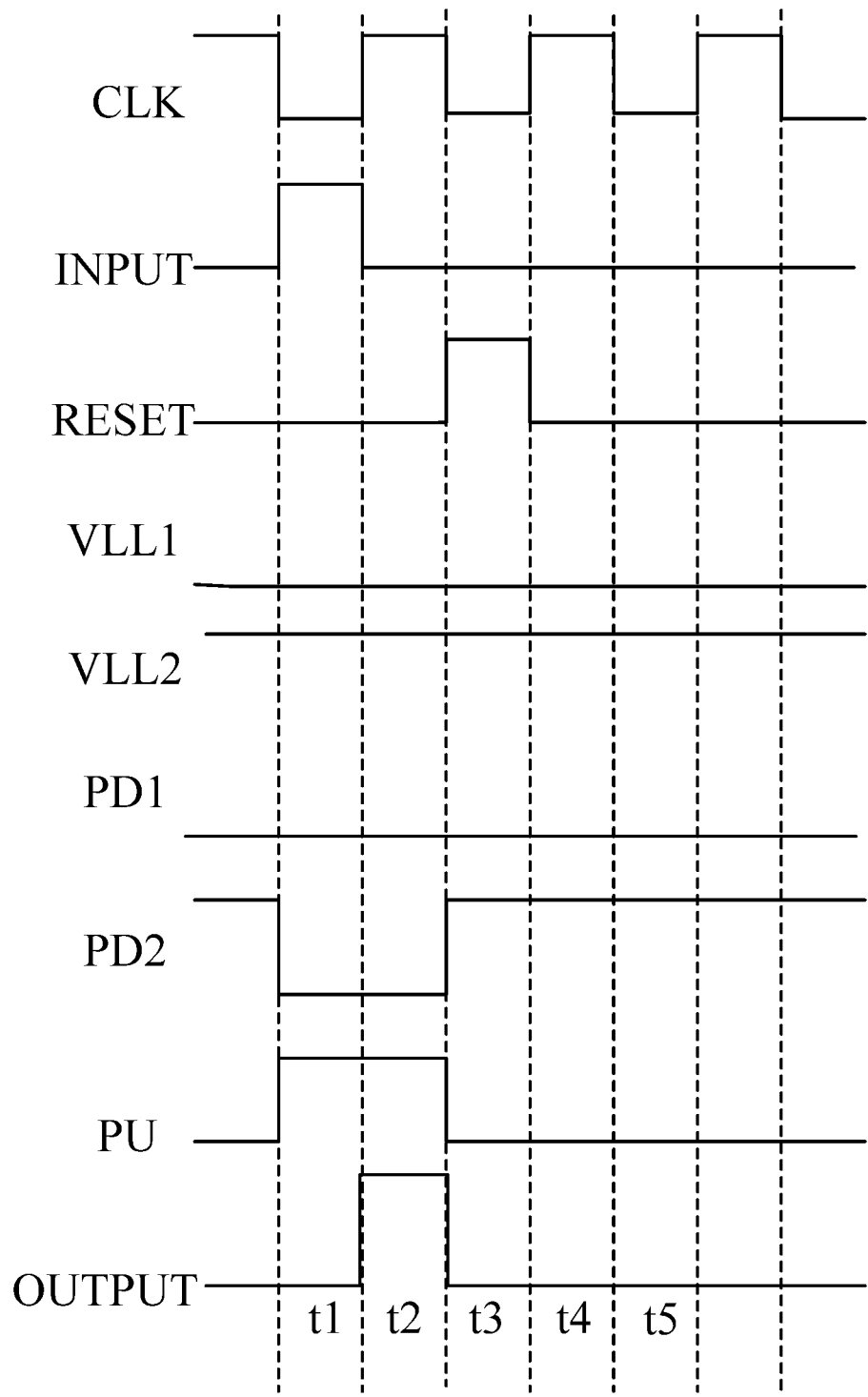
FIG. 5 is a sequence diagram of another type of control signals for a shift register unit according to an embodiment of the present disclosure.

A driving method of the shift register unit according to an embodiment of the present disclosure is described with reference to the sequence diagram of control signals shown in FIG. 5, wherein the method includes following stages.

At stage t1, the input signal INPUT is at high level, the clock signal CKL is at low level, and the reset signal RESET is at low level. In this case, the first thin-film transistor M1 is turned on, the pull-up node PU point is at high level, and at the same time the first capacitor C1 is charged. Then, the fifth thin-film transistor M5 is turned on to introduce the voltage VSS of the cathode of the power supply is into the first pull-down node PD1 such that the first pull-down node PD1 is at low level. The sixth thin-film transistor M6 is turned on to introduce the voltage VSS of the cathode of the power supply into the second pull-down node PD2 such that the second pull-down node PD2 is at low level. As the second square wave signal VLL2 is at high level and the first square wave signal VLL1 is at low level, the tenth thin-film transistor M10 is turned on to introduce the high level of the second square wave signal VLL2 into the second pull-down node PD2. However, as the voltage VSS of the cathode of the power supply is lower than the low level of the square wave signals and the pulling down effect of the low level of the voltage VSS of the cathode of the power supply is greater than the pulling up effect of the high level of the second square wave signal VLL2, the voltage VSS of the cathode of the power supply is introduced into the second pull-down node PD2 due to the turning on of the tenth thin-film transistor M10 such that the second pull-down node PD2 is kept at low level, even if the high level of the second square wave signal VLL2 is introduced into the second pull-down node PD2. Meanwhile, the second capacitor C2 and the third capacitor C3 are charged by the high level of the second square wave signal VLL2 in the first pull-down module, such that the high level of the second square wave signal VLL2 cannot be introduced into the first pull-down node PD1, and thus the eighth thin-film transistor M8 and the ninth thin-film transistor M9 connected to the second pull-down node PD1 are cutoff, thereby decreasing the duty cycle of the thin-film transistors connected to the first pull-down node PD1. As the PU point is at high level, the second thin-film transistor M2 is turned on, the low level of the clock signal CLK is introduced into the output lead OUTPUT, and the output lead OUTPUT outputs a low level.

At stage t2, the input signal INPUT is at low level, the clock signal CLK is at high level, and the reset signal RESET is at low level. At this point, the first thin-film transistor is cutoff, and due to the discharging effect of the first capacitor C1, the PU point is kept at high level. The second thin-film transistor is kept ON to introduce the high level of the clock signal CLK into the output lead OUTPUT such that the output lead OUTPUT outputs a high level.

At stage t3, the input signal INPUT is at low level, the clock signal CLK is at low level, and the reset signal RESET is at high level. At this point, the third thin-film transistor M3 is turned on, the voltage VSS of the cathode of the power supply is introduced into the pull-up node PU point, and the PU point thus is at low level. The fourth thin-film transistor M4 is turned on, the voltage VSS of the cathode of the power supply is introduced into the output lead OUTPUT, and the output lead OUTPUT is at low level. As the PU point is at low level, the sixth thin-film transistor M6 is cutoff and at the same time the tenth thin-film transistor M10 is turned on to introduce a high level to the second pull-down node PD2. As the sixth thin-film transistor M6 is cutoff, the voltage of the second pull-down node PD2 is affected by only the second square wave signal VLL2, so that the second pull-down node PD2 is at high level, the eleventh thin-film transistor M11 is turned on, and the low level of the first square wave signal VLL1 is introduced into the output lead OUTPUT. Meanwhile, the twelfth thin-film transistor M12 is turned on, the low level of the first square wave signal VLL1 is introduced into the pull-up node PU point, and the PU point is at low level. As the PU point is at low level, the fifth thin-film transistor M5 is cutoff and the first pull-down node PD1 is kept at low level.

At stage t4, the input signal INPUT is at low level, the clock signal CLK is at high level, and the reset signal RESET is at low level. At this point, the third thin-film transistor M3 and the fourth thin-film transistor M4 are cutoff and a low level of the pull-up node PU point and the output lead OUTPUT can only be achieved be means of the effect of the first and second pull-down modules. As the second square wave signal VLL2 is at high level, the tenth thin-film transistor M10 is kept ON and the second pull-down node PD2 is kept at high level, thereby the eleventh thin-film transistor M11 is turned on to introduce the low level of the first square wave signal VLL1 into the output lead OUTPUT, and at the same time the twelfth thin-film transistor M12 is turned on to introduce the low level of the first square wave signal VLL1 into the pull-up node PU point such that the pull-up node PU point is at low level. Accordingly, the output lead OUTPUT outputs a low level at stage t4.

At stage t5, the input signal INPUT is at low level, the clock signal CLK is at low level, and the reset signal RESET is at low level. At this point, the tenth thin-film transistor M10 is kept ON, the second pull-down node PD2 is kept at high level, the eleventh thin-film transistor M11 is turned on to introduce the low level of the first square wave signal VLL1 into the output lead OUTPUT, and at the same time the twelfth thin-film transistor M12 is turned on to introduce the low level of the first square wave signal VLL1 into the pull-up node such that the PU point is at low level. Accordingly, the output lead OUTPUT outputs a low level at stage t4.

After stage t5, stages t4 and t5 are repeated until the sequences of stage t1, stage t2 and stage t3 occur in this order, and stages t1, t2 and t3 are performed again, i.e. the third and fourth thin-film transistors M3 and M4 as well as the eleventh and twelfth thin-film transistors M11 and M12 discharge the PU point and the OUTPUT point alternately, such that the OUTPUT point and the PU point are kept at low level during any period of time except the period of time during which a high level is outputted.

In conclusion, when the first square wave signal VLL1 is at high level and the second square wave signal VLL2 is at low level, the first pull-down module is enabled and the gates of the eighth and ninth thin-film transistors M8 and M9 connected to the first pull-down node PD1 are at high level; and when the first square wave signal VLL1 is at low level and the second square wave signal VLL2 is at high level, the second pull-down module is enabled and the gates of the eleventh and twelfth thin-film transistors M11 and M12 connected to the second pull-down node PD2 are at high level. As the first square wave signal VLL1 and the second square wave signal VLL2 are square wave signals switching between a high level and a low level, either the thin-film transistors connected to the first pull-down node or the thin-film transistors connected to the second pull-down node are turned on at the same time in the present disclosure, such that the first pull-down module and the second pull-down module are enabled alternately. Therefore the duty cycle of the thin-film transistors connected to the first pull-down node and the thin-film transistors connected to the second pull-down node is decreased in order to prevent the thin-film transistors from aging and increase the lifetime of the thin-film transistors.

Figure 6:
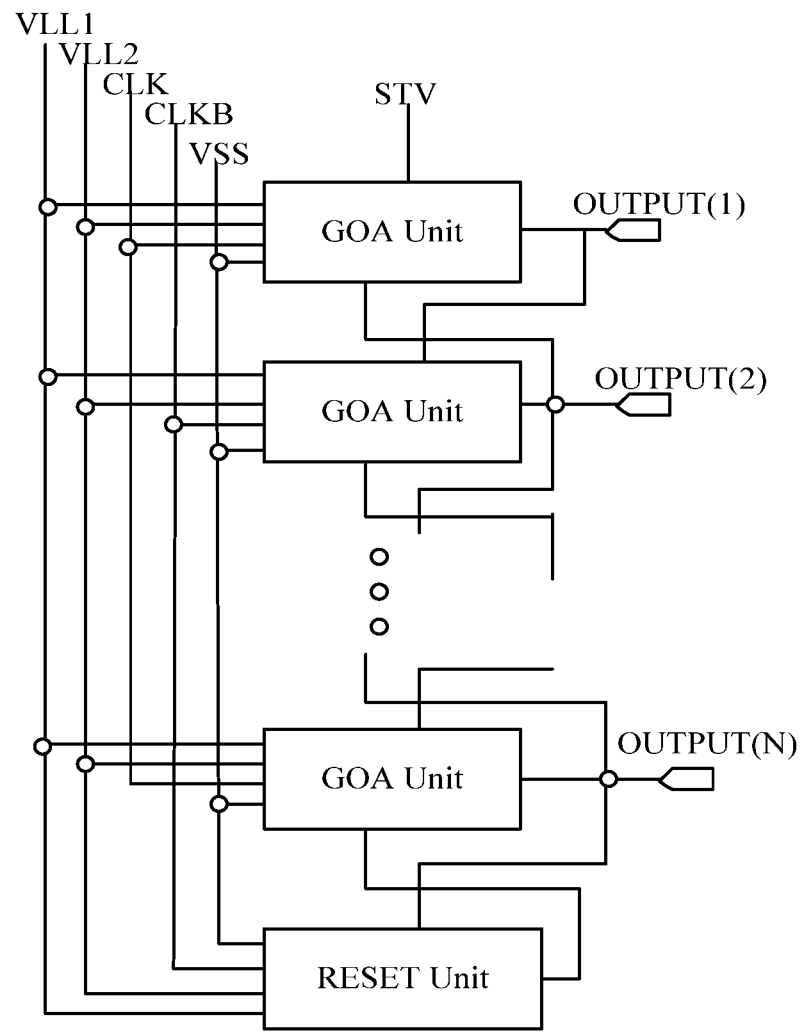
FIG. 6 is a structural schematic diagram of an array substrate gate driving device according to an embodiment of the present disclosure.

Reference is made to FIG. 6 which is a structural schematic diagram of an array substrate gate driving device according to an embodiment of the present disclosure, wherein this structure includes one or more cascaded shift register units as described above.

If the entire gate driving circuit have N stages of shift register units (GOA unit) in total where N is the number of gate lines, the INPUT of the first stage is provided by a start vertical (STV) signal, the RESET signal of the first stage is provided by the OUTPUT of the second stage (if any), the INPUT of the $N_{th}$ stage is provided by the OUTPUT of the $(N-1)_{th}$ stage (if any), and the RESET signal of the $N_{th}$ stage is provided by a RESET unit. The input signal INPUT of the $n_{th}$ (1<n<N, if any) stage is provided by the output OUTPUT of the $(n-1)_{th}$ stage, the reset signal RESET of the $n_{th}$ stage is provided by the output OUTPUT of the $(n+1)_{th}$ stage.

An embodiment of the present disclosure provides a display panel including the array substrate gate driving device as described above.

In conclusion, embodiments of the present disclosure provide a shift register unit including an input module, an output module, a reset module, a function module, a first pull-down module and a second pull-down module. This shift register unit may decrease the duty cycle of the thin-film transistors connected to the first pull-down node and the thin-film transistors connected to the second pull-down node in order to prevent the thin-film transistors from aging and increase the lifetime of the thin-film transistors.

Obviously, various modifications or variations may be made to the present disclosure by persons skilled in the art without departing from the spirit and scope of the present disclosure. As such, if these modifications and variations to the present disclosure fall within the scope of the claims of the present disclosure and their equivalents, the present disclosure is intended to cover these modifications and variations.

The invention claimed is:

1. A shift register unit comprising:
an input module;
an output module;
a reset module;
a function module;
a first pull-down module; and
a second pull-down module;
wherein a control terminal of the first pull-down module is connected to a first pull-down node, a first input terminal of the first pull-down module is connected to a first square wave signal, a second input terminal of the first pull-down module is connected to a second square wave signal, a first output terminal of the first pull-down module is connected to a pull-up node, and a second output terminal of the first pull-down module is connected to an output lead;
a control terminal of the second pull-down module is connected to a second pull-down node, a first input terminal of the second pull-down module is connected to the second square wave signal, a second input terminal of the second pull-down module is connected to the first square wave signal, a first output terminal of the second pull-down module is connected to the pull-up node, and a second output terminal of the second pull-down module is connected to the output lead;

wherein the first pull-down node is a first output node of the function module, the second pull-down node is a second output node of the function module, and the pull-up node is an output node of the input module; and
the first pull-down module is configured to provide a low level of the second square wave signal to the pull-up node and the output lead in response to a high level of the first square wave signal and a high level signal at the first pull-down node;
the second pull-down module is configured to provide a low level of the first square wave signal to the pull-up node and the output lead in response to a high level of the second square wave signal and the high level signal at the second pull-down node;
wherein the second square wave signal is at low level when the first square wave signal is at high level, and the second square wave signal is at high level when the first square wave signal is at low level; wherein a control terminal of the output module is connected to the output terminal of the input module, an input terminal of the output module is connected to a clock signal, and an output terminal of the output module is connected to the output lead; and the output module is configured to provide a voltage of the clock signal to the output lead in response to a voltage signal at the pull-up node; wherein the clock signal is different from the first and second square wave signals.

2. The shift register unit according to claim 1, wherein an input terminal and a control terminal of the input module are connected to an input signal, and an output terminal of the input module is the pull-up node; and the input module is configured to provide the input signal to the pull-up node in response to the input signal.

3. The shift register unit according to claim 1, wherein a control terminal of the reset module is connected to a reset signal, an input terminal of the reset module is connected to a cathode of a power supply, a first output terminal of the reset module is connected to the pull-up node, and a second output terminal of the reset module is connected to the output lead; and the reset module is configured to provide a voltage of the cathode of the power supply to the pull-up node and the output lead in response to the reset signal.

4. The shift register unit according to claim 1, wherein a control terminal of the function module is connected to the pull-up node, an input terminal of the function module is connected to is connected to the cathode of the power supply, a first output terminal of the function module is connected to the first pull-down node, and a second output terminal of the function module is connected to the second pull-down node; and the function module is configured to provide the voltage of the cathode of the power supply to the first pull-down node and the second pull-down node in response to the voltage signal at the pull-up node.

5. The shift register unit according to claim 2, wherein the input module comprises:
a first thin-film transistor, wherein a control terminal and a first terminal of the first thin-film transistor are connected to an input signal terminal, a second terminal of the first thin-film transistor serves as the output node of the input module, the output node being the pull-up node.

6. The shift register unit according to claim 1, wherein the output module comprises:
a second thin-film transistor, wherein a control terminal of the second thin-film transistor is connected to the pull-up node, a first terminal of the second thin-film transistor is connected to a clock signal input terminal, and a second terminal of the second thin-film transistor is connected to the output lead; and a first capacitor connected between the pull-up node and the output lead.

7. The shift register unit according to claim 3, wherein the reset module comprises:

a third thin-film transistor, wherein a control terminal of the third thin-film transistor is connected to a reset signal input terminal, a first terminal of the third thin-film transistor is connected to a power supply cathode voltage terminal, and a second terminal of the third thin-film transistor is connected to the pull-up node; and a fourth thin-film transistor, wherein a control terminal of the fourth thin-film transistor is connected to the reset signal input terminal, a first terminal of the fourth thin-film transistor is connected to the power supply cathode voltage terminal, and a second terminal of the fourth thin-film transistor is connected to the output lead.

8. The shift register unit according to claim 4, wherein the function module comprises:

a fifth thin-film transistor, wherein a control terminal of the fifth thin-film transistor is connected to the pull-up node, a first terminal of the fifth thin-film transistor is connected to the power supply cathode voltage terminal, and a second terminal of the fifth thin-film transistor serves as the first output node of the function module, the first output node being the first pull-down node; and a sixth thin-film transistor, wherein a control terminal of the sixth thin-film transistor is connected to the pull-up node, a first terminal of the sixth thin-film transistor is connected to the first pull-down node, and a second terminal of the sixth thin-film transistor serves as the second output node of the function module, the second output node being the second pull-down node.

9. The shift register unit according to claim 1, wherein the first pull-down module comprises:

a seventh thin-film transistor, wherein a control terminal and a first terminal of the seventh thin-film transistor are connected to a first square wave signal input terminal and a second terminal of the seventh thin-film transistor is connected to the first pull-down node;

an eighth thin-film transistor, wherein a control terminal of the eighth thin-film transistor is connected to the first pull-down node, a first terminal of the eighth thin-film transistor is connected to a second square wave signal input terminal, and a second terminal of the eighth thin-film transistor is connected to the output lead;

a ninth thin-film transistor, wherein a control terminal of the ninth thin-film transistor is connected to the first pull-down node, a first terminal of the ninth thin-film transistor is connected to the second square wave signal input terminal, and a second terminal of the ninth thin-film transistor is connected to the pull-up node;

a second capacitor connected between the first pull-down node and the second square wave signal input terminal; and a third capacitor connected in parallel with the second capacitor.

10. The shift register unit according to claim 1, wherein the second pull-down module comprises:

a tenth thin-film transistor, wherein a control terminal and a first terminal of the tenth thin-film transistor are connected to the second square wave signal input terminal, and a second terminal of the tenth thin-film transistor is connected to the second pull-down node;

a eleventh thin-film transistor, wherein a control terminal of the eleventh thin-film transistor is connected to the second pull-down node, a first terminal of the eleventh thin-film transistor is connected to the first square wave signal input terminal, and a second terminal of the eleventh thin-film transistor is connected to the output lead;

a twelfth thin-film transistor, wherein a control terminal of the twelfth thin-film transistor is connected to the second pull-down node, a first terminal of the twelfth thin-film transistor is connected to the first square wave signal input terminal, and a second terminal of the twelfth thin-film transistor is connected to the pull-up node;

a fourth capacitor connected between the second pull-down node and the first square wave signal input terminal; and a fifth capacitor connected in parallel with the fourth capacitor.

11. An array substrate gate driving device comprising cascaded shift register units of claim 1.

12. A display panel comprising the array substrate gate driving device of claim 11.

13. A driving method of a shift register unit, the method comprising:

providing, by an input module, a voltage of an input signal to a pull-up node when the input signal is received;

providing, by an output module, a voltage of a clock signal to an output lead upon a voltage signal of the pull-up node is received;

providing, by a reset module, a voltage of a cathode of a power supply to the pull-up node and an output lead when a reset signal is received;

providing, by a function module, the voltage of the cathode of the power supply to a first pull-down node and a second pull-down node upon the voltage signal of the pull-up node is received;

providing, by a first pull-down module, a low level of a second square wave signal to the pull-up node and the output lead upon a high level of a first square wave signal and a high level signal at the first pull-down node are received; and providing, by a second pull-down module, a low level of a first square wave signal to the pull-up node and the output lead upon a high level of a second square wave signal and a high level signal at the second pull-down node are received;

wherein the first pull-down node is a first output node of the function module, the second pull-down node is a second output node of the function module, and the pull-up node is an output node of the input module; and wherein the second square wave signal is at low level when the first square wave signal is at high level, and the second square wave signal is at high level when the first square wave signal is at low level; wherein the clock signal is different from the first and second square wave signals.

* * * * *